US008921859B2

(12) United States Patent
Kang et al.

(10) Patent No.: US 8,921,859 B2
(45) Date of Patent: Dec. 30, 2014

(54) ARRAY SUBSTRATE FOR ELECTROPHORESIS TYPE DISPLAY DEVICE AND METHOD OF MANUFACTURING THE SAME, METHOD OF REPAIRING A LINE OF THE SAME

(75) Inventors: Seung-Chul Kang, Gumi-si (KR); Sung-Jin Park, Daegu (KR)

(73) Assignee: LG Display Co., Ltd., Seoul (KR)

( * ) Notice: Subject to any disclaimer, the term of this patent is extended or adjusted under 35 U.S.C. 154(b) by 742 days.

(21) Appl. No.: 12/633,927

(22) Filed: Dec. 9, 2009

(65) Prior Publication Data
US 2010/0163881 A1  Jul. 1, 2010

(30) Foreign Application Priority Data

Dec. 26, 2008  (KR) .................. 10-2008-0134708

(51) Int. Cl.
| H01L 29/04 | (2006.01) |
| H01L 27/12 | (2006.01) |
| G02F 1/1362 | (2006.01) |
| G02F 1/1333 | (2006.01) |
| G02F 1/167 | (2006.01) |

(52) U.S. Cl.
CPC ...... *H01L 27/1214* (2013.01); *G02F 1/136259* (2013.01); *H01L 27/1288* (2013.01); *G02F 1/133345* (2013.01); *G02F 1/167* (2013.01); *G02F 2001/136236* (2013.01); *G02F 2001/136263* (2013.01)
USPC  257/59; 257/72; 257/E29.147; 257/E29.151; 438/149; 438/151; 349/43

(58) Field of Classification Search
USPC ......... 257/59, 72, E29.147, E29.151; 395/42, 395/43, 114; 438/30, 149, 151
See application file for complete search history.

(56) References Cited

U.S. PATENT DOCUMENTS

| 5,917,571 A | 6/1999 | Shimada |
| 6,100,954 A | 8/2000 | Kim et al. |

(Continued)

FOREIGN PATENT DOCUMENTS

| JP | H09-113930 | 5/1997 |
| JP | H09-325330 | 12/1997 |

(Continued)

OTHER PUBLICATIONS

Japanese Office Action (Application No. 2009-290137), dated Jul. 2, 2012, with machine-generated English translation.

(Continued)

*Primary Examiner* — David Vu
(74) *Attorney, Agent, or Firm* — Morgan, Lewis & Bockius LLP

(57) ABSTRACT

An array substrate for an electrophoresis type display device includes a plurality of gate lines on a substrate; a gate insulating layer on the plurality of gate lines; a plurality of data lines on the gate insulating layer and crossing the plurality of gate lines to define a plurality of pixel regions; a thin film transistor corresponding to each pixel region, the thin film transistor including a gate electrode, a semiconductor layer, and source and drain electrodes; a first passivation layer on the plurality of data lines; a second passivation layer on the first passivation layer, wherein the second passivation layer includes a first hole over the data line, and/or a second hole over the gate line with at least the gate insulating layer therebetween; and a pixel electrode on the second passivation layer and connected to the drain electrode, wherein a portion of the pixel electrode covers the first hole, and another portion of the pixel electrode covers the second hole. A method of manufacturing the same, and a method of repairing a line of the same is also disclosed.

8 Claims, 11 Drawing Sheets

(56) References Cited

U.S. PATENT DOCUMENTS

| | | | |
|---|---|---|---|
| 7,075,110 B2 * | 7/2006 | Kim | 257/72 |
| 2001/0028418 A1 | 10/2001 | Ozaki et al. | |
| 2007/0103610 A1 | 5/2007 | Lee et al. | |
| 2008/0068324 A1 | 3/2008 | Chung et al. | |
| 2008/0117344 A1 | 5/2008 | Kim et al. | |

FOREIGN PATENT DOCUMENTS

| | | |
|---|---|---|
| JP | H10-41519 | 2/1998 |
| JP | 11305260 A | 11/1999 |
| JP | 2002182246 A | 6/2002 |
| JP | 2002278476 A | 9/2002 |
| JP | 2004212972 A | 7/2004 |
| JP | 2007256919 A | 10/2007 |
| JP | 2007256930 A | 10/2007 |
| KR | 2001-0093702 A | 10/2001 |
| KR | 2007-0049743 A | 5/2007 |

OTHER PUBLICATIONS

KIPO—Office Action for Korean Patent Application No. 10-2008-0134708 dated Dec. 3, 2012.

Japanese Office Action for Japanese Patent Application No. 2009-290137 dated Jul. 9, 2013.

* cited by examiner first dry-etching second dry-etching

ARRAY SUBSTRATE FOR ELECTROPHORESIS TYPE DISPLAY DEVICE AND METHOD OF MANUFACTURING THE SAME, METHOD OF REPAIRING A LINE OF THE SAME The present invention claims the benefit of Korean Patent Application No. 10-2008-0134708, filed in Korea on Dec. 26, 2008, which is hereby incorporated by reference for all purposes as if fully set forth herein.

BACKGROUND OF THE INVENTION

1. Field of the Invention

The present invention relates to an electrophoresis type display device, and more particularly, to an array substrate for an electrophoresis type display device, a method of manufacturing the same, and a method of repairing a line of the same.

2. Discussion of the Related Art

Until recently, display devices, such as liquid crystal display (LCD) devices, plasma display panels (PDPs) and organic electro-luminescence displays (OLEDs) have typically been used. Recently, besides the above display devices such as the LCDs, PDPs and OELDs, an electrophoresis type display device is suggested. The electrophoresis type display device has many advantages such as high contrast ratio, rapid response, low price and the like.

FIG. 1 is a schematic cross-sectional view illustrating a principle of operating an electrophoresis type display device.

Referring to FIG. 1, the electrophoresis type display device 1 includes first and second substrates 11 and 36, and an ink layer 57 between the first and second substrates 11 and 36. The ink layer 57 includes a plurality of capsules 63 each of which includes a plurality of white pigments 59 and a plurality of black pigments 61. The white and black pigments 59 and 61 are charged by condensation polymerization. The white pigments 59 have a negative polarity while the black pigments 61 have a positive polarity.

On the first substrate 11, a plurality of pixel electrodes 28 are formed in a plurality of pixel regions, respectively. The pixel electrodes 28 are selectively applied with a positive (+) voltage or a negative (−) voltage. Accordingly, the pigments 59 or 61 having the polarity opposite to the polarity of the pixel electrode 28 move in a direction toward the pixel electrode 28 while the pigments 59 or 61 having the polarity identical to the polarity of the pixel electrode 28 move in a direction away from the pixel electrode 28. Accordingly, according to the polarity relationship of the pigments 59 and 61 and the pixel electrode 28, when the black pigments 61 move in a direction away from the pixel electrode 28, a black color is displayed in the corresponding pixel region. To the contrary, when the white pigments 59 move in a direction away from the pixel electrode 28, a white color is displayed in the corresponding pixel region. This principle makes images displayed through the electrophoresis type display device.

FIG. 2 is a cross-sectional view illustrating the electrophoresis type display device according to the related art.

Referring to FIG. 2, the electrophoresis type display device 1 includes a first substrate 11, a second substrate 36, and an electrophoresis film 60. The electrophoresis film 60 includes an ink layer 57 comprising a plurality of capsules 63, a first adhesive layer 51 on one outer surface of the ink layer 57, a common electrode 55 on the other outer surface of the ink layer 57, and a second adhesive layer 53 on an outer surface of the common electrode 55. The capsule 63 includes a plurality of white pigments 59 and a plurality of black pigments 61.

The white pigments 59 are charged with negative polarity while the black pigments 61 are charged with positive polarity.

The second substrate 36 is made of a transparent material, such as plastic or glass. The first substrate 11 is made of an opaque material such as stainless. Alternatively, the first substrate 11 is made of a transparent material, such as plastic or glass.

A color filter 40 including red (R), green (G) and blue (B) color filter patterns is formed on an inner surface of the second substrate 36.

A gate line 12 and a data line 19 crossing each other to define a pixel region P are formed on an inner surface of the first substrate 11. A thin film transistor Tr is formed in the pixel region P. The thin film transistor Tr includes a gate electrode 13, a semiconductor layer 18 and source and drain electrodes 20 and 22. The semiconductor layer 18 includes an active layer 18a and an ohmic contact layer 18b. A gate insulating layer 16 is on the gate electrode 13.

First and second passivation layers 25 and 26 are on the thin film transistor Tr and include a drain contact hole 27 exposing the drain electrode 22. A pixel electrode 28 is formed on the second passivation layer 26 in the pixel region P. The pixel electrode 28 contacts the drain electrode 22 through the drain contact hole 27. The pixel electrode 28 is made of a transparent conductive material, such as indium-tin-oxide (ITO), indium-zinc-oxide (IZO) or indium-tin-zinc-oxide (ITZO).

The electrophoresis type display device 1 uses an external light, such as sun light or room light, as light source. The pixel electrode 28 is selectively applied with a negative or positive polarity voltage. According to the polarity of the pixel electrodes 28, the white pigments 59 and the black pigments 61 moves, and thus images are displayed.

Since the electrophoresis type display device 1 displays images using a reflection property of the ink layer 57, one of the factors increasing a reflectivity is increasing the reflective region. In order to allow the electrophoresis film 60 to function as a reflective medium, a pixel electrode 28 should be used on the first substrate 11. A region covered by the pixel electrode 28 is considered as the reflective region. Accordingly, as a size of the pixel electrode increases, the reflective region increases. Accordingly, in order to increase the reflective region, the pixel electrode 28 is formed to overlap the gate line and the data line 19.

However, when the pixel electrode 28 overlaps the gate line and the data line 19, this causes a parasitic capacitance between the pixel electrode 28 and each of the gate line and the data line 19 to increase, and signals of the gate line and the data line thus delay. To reduce the parasitic capacitance, the second passivation layer 26 made of an organic insulating material is formed on the first passivation layer 25 made of an inorganic insulating material.

However, when the second passivation layer 26 is formed with a thicker thickness, a problem happens in a repair process for the gate line and/or the data line. Particularly, in manufacturing processes, an open circuit of the gate line or the data line 19 due to external particles may occur. Therefore a repair process is performed to solve the open circuit. However, this repair process becomes difficult due to the second passivation layer 26.

FIG. 3 is a cross-sectional view illustrating a repair process for the gate line in the electrophoresis type display device according to the related art.

Referring to FIG. 3, when a gate line 12 on the substrate 11 is open-circuited, the portion of pixel regions P located after an open-circuited portion OC of the gate line 12 may not applied with signals. As a result, a line defect occurs, and so many pixel regions P connected to the defected line may be caused not to be normally operated. To change the line defect into a point defect, a repair process is performed. The point defect is making one or two pixel regions defected.

In more detail, the repair process is performed to form a bypass line by performing a welding process at both sides of the open-circuited portion OC of the gate line 12. In the welding process, a laser beam is irradiated on the both sides of the open-circuit portion OC of the gate line 12, and thus, a pixel electrode 28 and a neighboring pixel electrode 28 are melted, and a second passivation layer 26, a first passivation layer 25 and a gate insulating layer 16 below the both pixel electrodes 28 are removed to form holes 81. The melted pixel electrodes 28 stream down the contact holes 81 and contact the gate line 12. Further, the both pixel electrodes 28 are connected to each other through a connection pattern. Accordingly, the bypass line for the gate line is made through the melted pixel electrodes 28 and the connection pattern.

However, since the second passivation layer 26 is made of an organic insulating material and has a thicker thickness, the welding process is not appropriately performed. In other words, because of the property of the organic insulating material, inner wall surfaces of the contact holes 81 made by removing the second passivation layer 26 are very rough. This roughness disturbs the melted pixel electrode in streaming down the inner wall surfaces of the contact hole 81. Further, since the second passivation layer 26 is relatively very thick, and the melted amount of the pixel electrode 28 is relatively small, it may thus be not enough to cover the entire inner wall surfaces of the contact hole 81. Accordingly, the contact between the pixel electrode 28 and the gate line 12 through the contact hole 81 is not appropriately made, and the repair for the gate line 12 is not completed. This incomplete repair occurs to the data line 18 as well.

SUMMARY OF THE INVENTION

Accordingly, the present invention is directed to an array substrate for an electrophoresis type display device, a method of manufacturing the same, and a method of repairing a line of the same, which substantially obviates one or more of the problems due to limitations and disadvantages of the related art.

An advantage of the present invention is to provide an array substrate for an electrophoresis type display device, a method of manufacturing the same, and a method of repairing a line of the same that can improve reliability in repairing an open-circuited gate line or data line.

Additional features and advantages of the present invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the present invention, as embodied and broadly described herein, an array substrate for an electrophoresis type display device includes a plurality of gate lines on a substrate; a gate insulating layer on the plurality of gate lines; a plurality of data lines on the gate insulating layer and crossing the plurality of gate lines to define a plurality of pixel regions; a thin film transistor corresponding to each pixel region, the thin film transistor including a gate electrode, a semiconductor layer, and source and drain electrodes; a first passivation layer on the plurality of data lines; a second passivation layer on the first passivation layer, wherein the second passivation layer includes a first hole over the data line, and a second hole over the gate line with at least the gate insulating layer therebetween; and a pixel electrode on the second passivation layer and connected to the drain electrode, wherein a portion of the pixel electrode covers the first hole, and another portion of the pixel electrode covers the second hole.

Moreover, the array substrate may further comprise a third passivation layer made of an inorganic insulating material and between the pixel electrode and the second passivation layer.

Furthermore, each of the gate insulating layer and the first passivation layer may be made of an inorganic insulating material, and the second passivation layer may be made of an organic insulating material.

Further, a thickness of the second passivation layer may be about 2 micrometers to about 4 micrometers.

In a further aspect, an array substrate for an electrophoresis type display device comprises: a plurality of gate lines on a substrate; a gate insulating layer on the plurality of gate lines; a plurality of data lines on the gate insulating layer and crossing the plurality of gate lines to define a plurality of pixel regions; a thin film transistor corresponding to each pixel region, the thin film transistor including a gate electrode, a semiconductor layer, and source and drain electrodes; a first passivation layer on the plurality of data lines; a second passivation layer on the first passivation layer, wherein the second passivation layer includes a first hole over the data line, or a second hole over the gate line with at least the gate insulating layer therebetween; and a pixel electrode on the second passivation layer and connected to the drain electrode, wherein the pixel electrode covers the first hole or the second hole.

Moreover, the array substrate may further comprise a third passivation layer made of an inorganic insulating material and between the pixel electrode and the second passivation layer.

Furthermore, each of the gate insulating layer and the first passivation layer may be made of an inorganic insulating material, and the second passivation layer may be made of an organic insulating material.

Further, a thickness of the second passivation layer may be about 2 micrometers to about 4 micrometers.

In another aspect, a method of manufacturing an array substrate for an electrophoresis type display device includes forming a plurality of gate lines on a substrate; forming a gate insulating layer on the plurality of gate lines; forming a plurality of data lines on the gate insulating layer and crossing the plurality of gate lines to define a plurality of pixel regions; forming a thin film transistor corresponding to each pixel region, the thin film transistor including a gate electrode, a semiconductor layer, and source and drain electrodes; forming a first passivation layer on the plurality of data lines; forming a second passivation layer on the first passivation layer, wherein the second passivation layer includes a first hole over the data line at a side of each pixel region, or a second hole over the gate line at another side of each pixel region with at least the gate insulating layer therebetween; and forming a pixel electrode on the second passivation layer and connected to the drain electrode, wherein a portion of the pixel electrode covers the first hole or the second hole.

Furthermore, forming the second passivation layer may include: forming an organic insulating layer on the first passivation layer; performing a light exposure process using a halftone or diffraction mask and a developing process for the organic insulating layer to form first and second portions and a drain contact hole, wherein the first portion is thinner than the second portion and corresponds to the first hole or the second hole, and the drain contact hole exposes a portion of the first passivation layer over the drain electrode; removing the exposed portion of the first passivation layer through a first dry-etching to expose the drain electrode; and removing the first portion through a second dry-etching to form the first hole or the second hole and partially removing the second portion through the second dry-etching, thereby forming the second passivation layer.

Further, each of the gate insulating layer and the first passivation layer may be made of an inorganic insulating material.

Furthermore, a thickness of the second passivation layer may be about 2 micrometers to about 4 micrometers.

Moreover, the method may further comprise forming a third passivation layer made of an inorganic insulating material and between the pixel electrode and the second passivation layer.

In another aspect, a method of repairing an open-circuited gate line or data line of an array substrate for an electrophoresis type display device, wherein the array substrate including: a plurality of gate lines on a substrate; a gate insulating layer on the plurality of gate lines; a plurality of data lines on the gate insulating layer and crossing the plurality of gate lines to define a plurality of pixel regions; a thin film transistor corresponding to each pixel region; a first passivation layer on the plurality of data lines; a second passivation layer on the first passivation layer, wherein the second passivation layer includes a first hole over the data line or a second hole over the gate line with at least the gate insulating layer therebetween; and a pixel electrode on the second passivation layer and connected to the thin film transistor, wherein the pixel electrode covers the first hole or the second hole, wherein a plurality of pixel regions includes first and second pixel regions to repair the open-circuited gate line or third and fourth pixel regions to repair the open-circuited data line, wherein the method includes irradiating a laser beam on the first holes located at both sides, respectively, of an open-circuited portion of the open-circuited gate line, to melt the portions of the pixel electrodes of the first and second pixel regions and remove at least the gate insulating layer whereby the melted portions contact the gate line open-circuited gate line, or irradiating a laser beam on the second holes located at both sides, respectively, of an open-circuited portion of the open-circuited data line, to melt the portions of the pixel electrodes of the third and fourth pixel regions and remove the first passivation layer whereby the melted portions contact the open-circuited data line; and forming a connection pattern using a laser CVD repair apparatus to connect the pixel electrode of the first pixel region and the pixel electrode of the second pixel region, or to connect the pixel electrode of the third pixel region and the pixel electrode of the fourth pixel region.

Further, forming the connection pattern may include: supplying a repair gas between the array substrate and a laser beam irradiation device of the laser CVD apparatus; and irradiating a laser beam from the laser beam irradiation device to photodecompose the gas and deposit particles of the photodecomposed repair gas at the pixel electrodes of the first and second pixel regions and between the pixel electrodes of the first and second pixel regions, or at the pixel electrodes of the third and fourth pixel regions and between the pixel electrodes of the third and fourth pixel regions.

Furthermore, the repair gas may be a tungsten hexacarbonyl $(W(CO)_6)$ gas.

Furthermore, each of the gate insulating layer and the first passivation layer may be made of an inorganic insulating material.

Moreover, a thickness of the second passivation layer may be about 2 micrometers to about 4 micrometers.

It is apparent to those skilled in the art that various modifications, variations and combinations can be made based on the above features.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the Drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
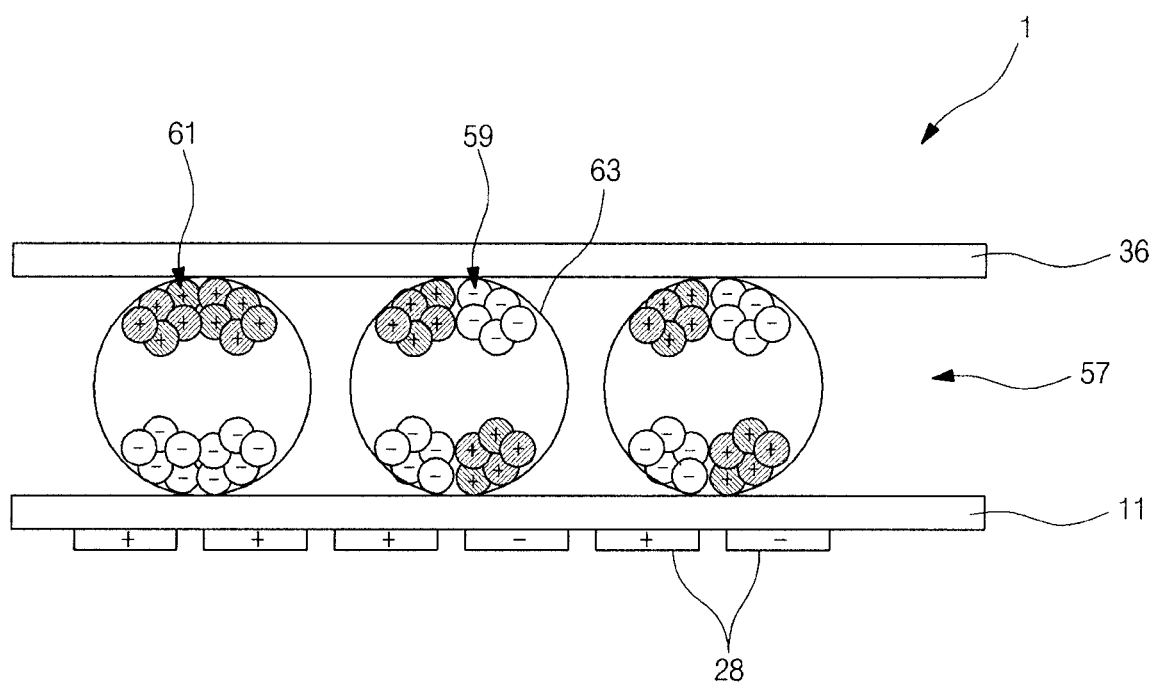
FIG. 1 is a schematic cross-sectional view illustrating a principle of operating an electrophoresis type display device.
Figure 2:
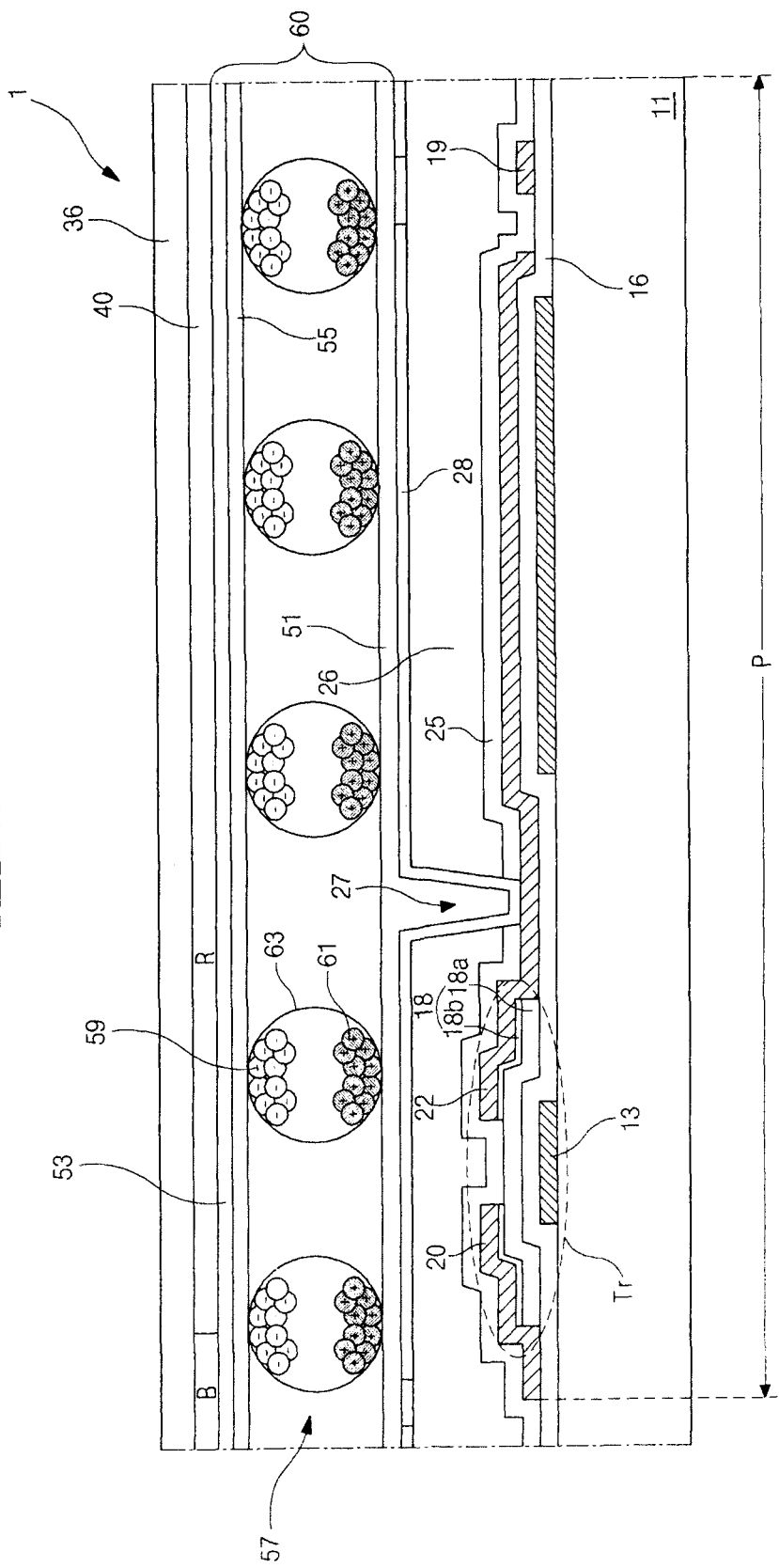
FIG. 2 is a cross-sectional view illustrating the electrophoresis type display device according to the related art.
Figure 3:
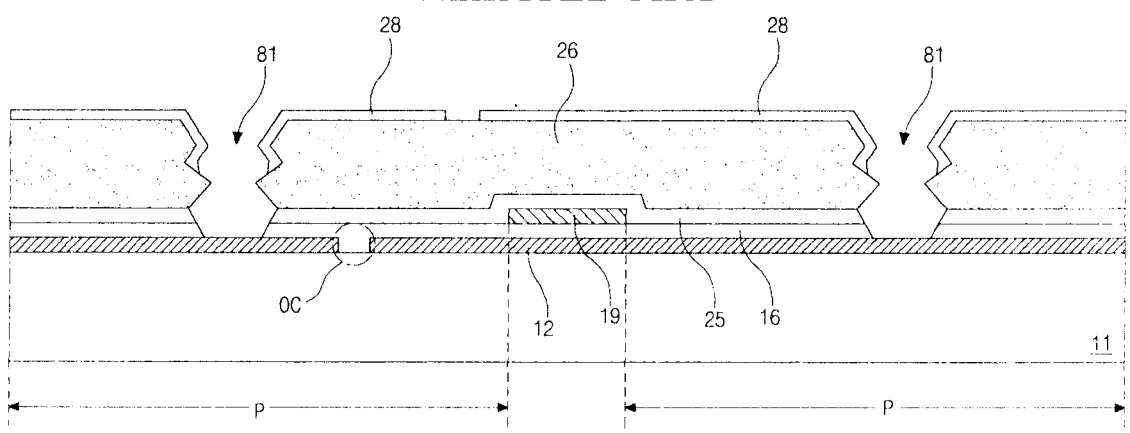
FIG. 3 is a cross-sectional view illustrating the repair process for the gate line in the electrophoresis type display device according to the related art.
Figure 4:
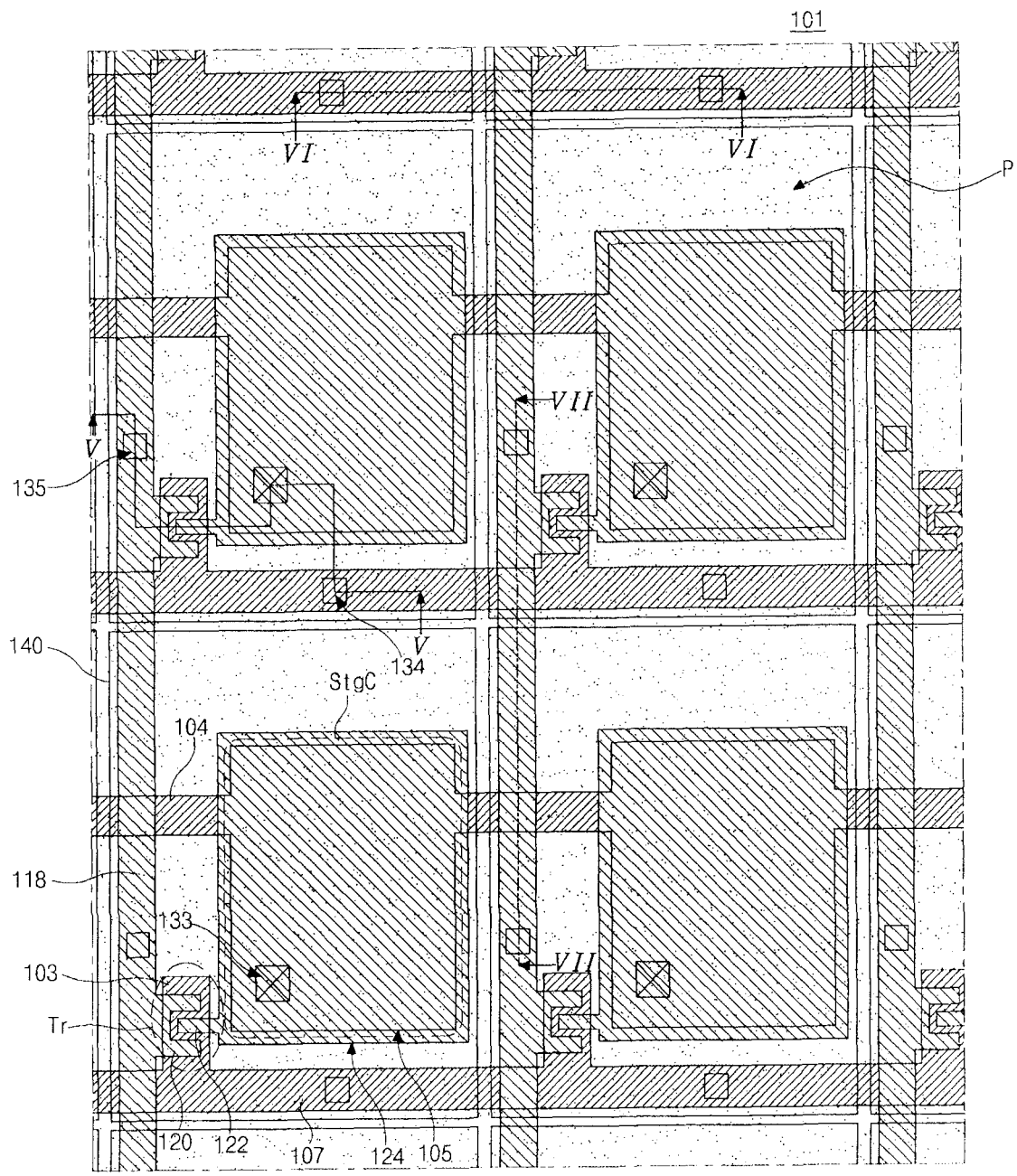
FIG. 4 is a plan view illustrating an electrophoresis type display device according to an embodiment of the present invention.
Figure 5:
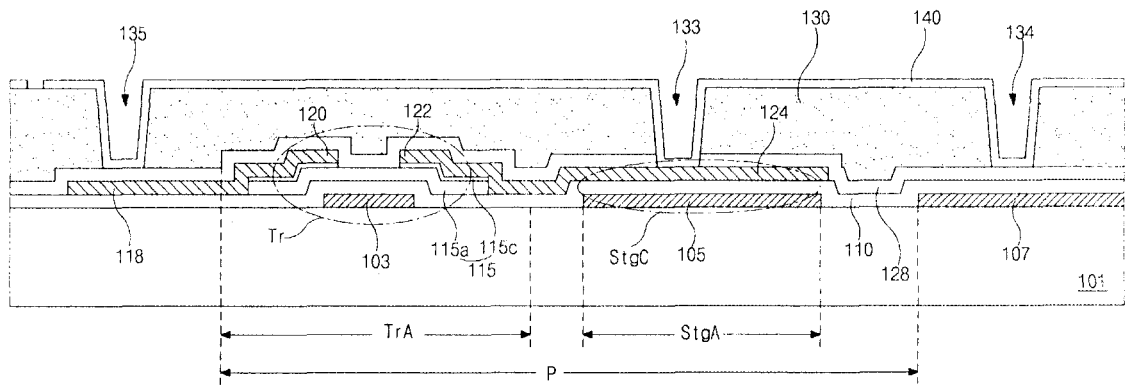
FIGS. 5 to 7 are cross-sectional views taken along lines V-V to VII-VII of FIG. 4, respectively.
Figure 6:
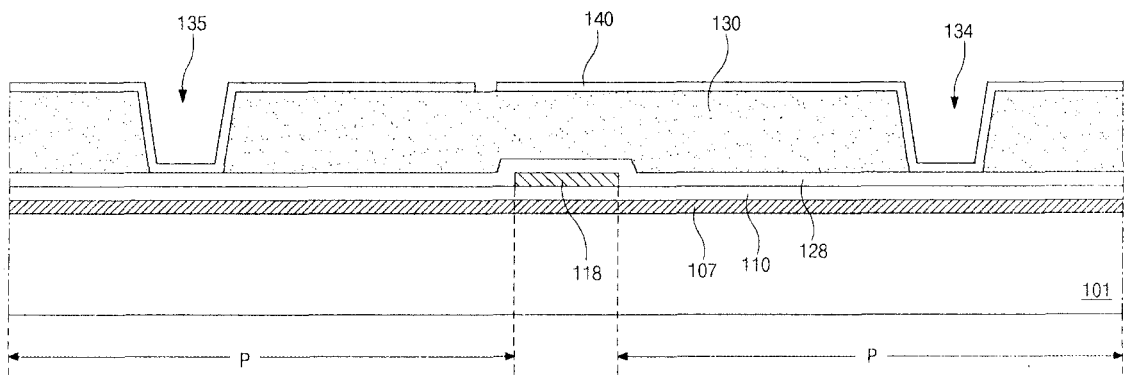
Figure 7:
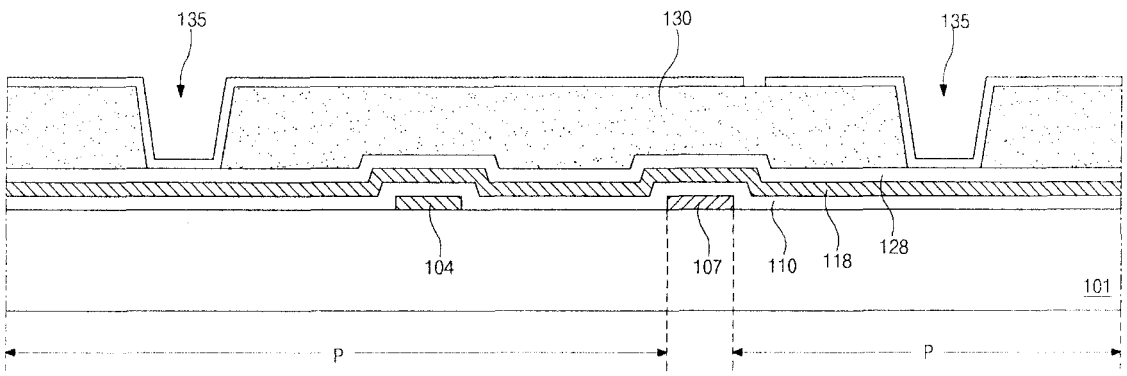

FIG. 4 is a plan view illustrating an electrophoresis type display device according to an embodiment of the present invention, and FIGS. 5 to 7 are cross-sectional views taken along lines V-V to VII-VII of FIG. 4, respectively.

Referring to FIGS. 4 to 7, the electrophoresis type display device includes an array substrate including a plurality of pixel regions P in a matrix form.

The array substrate includes a gate line 107 and a data line 118 crossing each other on a substrate 101 to define the pixel region P. A common line 104 is parallel to and spaced apart from the gate line 107. The common line 104 may be formed at the same layer and of the same material as the gate line 107. A first storage electrode 105 extends from the common line 104.

A thin film transistor Tr is formed in a switching region and connected to the gate line 107 and the data line 118. The thin film transistor Tr includes a gate electrode 103, a semiconductor layer 115 and source and drain electrodes 120 and 122. The semiconductor layer 115 includes an active layer 115a made of intrinsic amorphous silicon, and an ohmic contact layer 115c made of extrinsic amorphous silicon. The source electrode 120 extends from the data line 118. A gate insulating layer 110 is formed on the gate electrode 103, the gate line 107, the common line 104 and the first storage electrode 105.

The drain electrode 122 extends over and overlaps the first storage electrode 105. The extended and overlapped portion of the drain electrode 122 with respect to the first storage electrode 105 may be referred to as a second storage electrode 124. The first and second storage electrode 105 and 124 together with the gate insulating layer 110 therebetween form a storage capacitor StgC in a storage region StgA.

A first passivation layer 128 is formed on the thin film transistor Tr. The first passivation layer 128 is made of an inorganic insulating material, such as silicon oxide ($SiO_2$) or silicon nitride (SiNx).

A second passivation layer 130 is formed on the first passivation layer 128. The second passivation layer 130 is made of an organic insulating material, such as benzocyclobutene (BCB) or acrylic resin. The second passivation layer 130 may have a thickness of about 2 micrometers (μm) to about 4 micrometers (μm).

The first and second passivation layers 128 and 130 include a drain contact hole 133 exposing the drain electrode 122. The second passivation layer 130 includes a first hole 134 and a second hole 135. The first hole 134 exposes a portion of the first passivation layer 128 on the gate line 107 between neighboring data lines 118. The second hole 135 exposes a portion of the first passivation layer 128 on the data line 118 between neighboring gate lines 107. The number of the first hole 134 over the gate line 107 between neighboring data lines 118 is one or more, and the number of the second hole 135 on the data line 118 between neighboring gate line 107 is one or more.

The second passivation layer 130 may be substantially formed on the entire surface of the first passivation layer 128. Alternatively, the second passivation layer 130 may be formed at positions corresponding to the gate line 107, the data line 118 and the thin film transistor Tr.

A pixel electrode 140 is formed on the second passivation layer 130 and contacts the drain electrode 122 through the drain contact hole 133. The pixel electrode 140 is made of a transparent conductive material, such as indium-tin-oxide (ITO), indium-zinc-oxide (IZO) or indium-tin-zinc-oxide (ITZO). The pixel electrode 140 covers the first and second holes 134 and 135. Accordingly, the pixel electrode 140 contacts the portions of the first passivation layer 128 through the first and second contact holes 134 and 135.

The pixel electrode 140 overlaps the gate line 107 and the data line 118. It is preferred that the pixel electrode 140 extends over both of the gate line 107 and the data line 118 to neighboring pixel regions P so that the pixel electrode 140 overlaps the neighboring pixel regions P. Accordingly, a reflective region, which is a region covered by the pixel electrode 140, increases, and a reflectivity of the electrophoresis type display device thus increases.

The data line 118 overlapping the pixel electrode 140 may be one of neighboring data lines 118 at opposing sides of the corresponding pixel region P, and the gate line 107 overlapping the pixel electrode 140 may be one of neighboring gate lines 107 at other opposing sides of the corresponding pixel region P. For example, the data line 118 overlapping the pixel electrode 140 is a data line connected to the corresponding pixel region P, and the gate line 107 overlapping the pixel electrode 140 is a gate line connected to the corresponding pixel region.

In the embodiment, the second passivation layer 130 is made of an organic insulating material and has a thickness of about 2 micrometers (μm) to about 4 micrometers (μm). However, since the first and second holes 134 and 135 are formed in the second passivation layer 130, a repair process for the gate line 107 or the data line 118 is more reliable than the related art. In more detail, when the gate line 107 or the data line 118 has an open-circuit defect, a welding process is performed at the positions where the first holes or second holes 134 or 135 at both sides of the open-circuit defect are located. At the welding position, the second passivation layer 130 has already been removed, and the first passivation layer/gate insulating layer 128/110 or the first passivation layer 128 are formed. Each of the gate insulating layer 110 and the first passivation layer 128 has about 1000 Å to about 4000 Å. A total thickness of the gate insulating layer 110 and the first passivation layer 128 is equal to or less than about 0.5 micrometers (μm). Accordingly, in the welding process, a height by which a melted pixel electrode 140 streams down for repair is at most about 0.5 micrometers (μm). In other words, this height is at most about ¼ or about ⅛ or less of the height of the related art because of forming the first and second holes 134 and 135. Further, since the first passivation layer 128 and the gate insulating layer 110 are made of an inorganic insulating material, inner wall surfaces of a contact hole made in the first passivation layer 128 or the first passivation layer/gate insulating layer 128/110 by the welding are smooth. Accordingly, the melted pixel electrode 140 smoothly streams down the inner wall surfaces without break.

As a result, since the height for the melted pixel electrode 140 to stream down is much less than that of the related art, and the inner wall surfaces of the contact hole is much smoother than that of the related art, the melted amount of the pixel electrode 140 is relatively large enough to cover the entire inner wall surfaces of the contact hole, and the melted pixel electrode 140 can smoothly stream down. Accordingly, the connection of the pixel electrode 140 and the gate line 107 or the data line 118 can be stably made, and the repair for the gate line 107 or data line 118 can be reliably completed.

Further, since the second passivation layer 130 having the thickness of about 2 micrometers (μm) to about 4 micrometers (μm) are formed between the pixel electrode 140, and the gate and data lines 107 and 118, even though the pixel electrode 140 overlaps the gate and data lines 107 and 118, parasitic capacitances between the pixel electrode 140, and the gate and data lines 107 and 118 can be remarkably reduced, and the reflective region can be increased.

In a further embodiment, a third passivation layer made of an inorganic insulating material may be optionally formed between the second passivation layer 130 and the pixel electrode 140. An inorganic insulating material has a property of adhesion to the pixel electrode 140 better than an organic insulating material. Accordingly, to improve adhesion to the pixel electrode 140, the third passivation layer may be intervened between the second passivation layer 130 and the pixel electrode 140. When the third passivation layer is used in the electrophoresis type display device, the first and second holes 134 and 135 are formed in the third passivation layer and the second passivation layer 130 to expose the first passivation layer 128, and the drain contact hole 133 is formed in the third passivation layer, the second passivation layer 130 and the first passivation layer 128 to expose the drain electrode 122.

FIGS. 8A to 8H are cross-sectional views, taken along the line V-V of FIG. 4, illustrating a method of manufacturing the array substrate for the electrophoresis type display device according to the embodiment of the present invention.

Figure 8A:
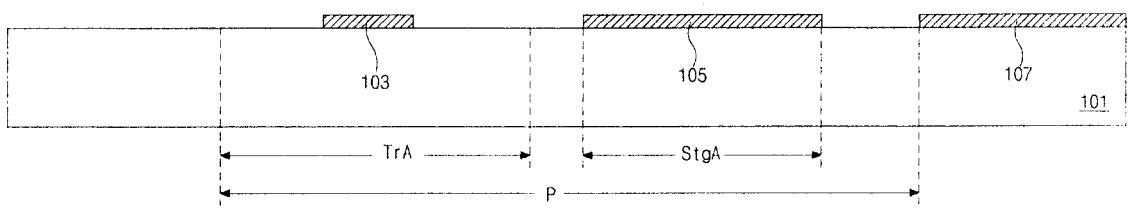
FIGS. 8A to 8H are cross-sectional views, taken along the line V-V of FIG. 4, illustrating a method of manufacturing the array substrate for the electrophoresis type display device according to the embodiment of the present invention.

Referring to FIG. 8A, a first metal layer is formed on a substrate 101 and patterned in a mask process to form a gate electrode 103, a gate line 107, a common line (104 of FIG. 4) and a first storage electrode 105. The first metal layer may be made of one of aluminum (Al), aluminum alloy (eg. AlNd), copper (Cu), copper alloy, chromium and titanium alloy or the like. Alternatively, the first metal layer may have a multiple layered structure using the materials. For example, as a double-layered structure, an aluminum alloy/molybdenum or titanium alloy/copper structure is used. The mask process may include: coating a photoresist layer, a light exposure, developing the photoresist layer, an etching process, and stripping the photoresist layer. The gate electrode 103 is formed in a switching region TrA, and the first storage electrode 105 is formed in a storage region StgA.

Figure 8B:
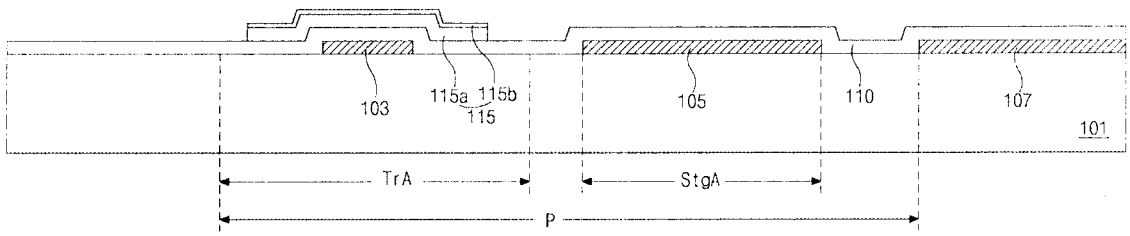

Referring to FIG. 8B, the gate insulating layer 110 is formed on the substrate 101 having the gate electrode 103. The gate insulating layer 110 may be made of an inorganic insulating material, such as silicon oxide ($SiO_2$) or silicon nitride (SiNx).

Then, an intrinsic amorphous silicon layer and an extrinsic amorphous silicon layer are formed on the gate insulating layer 110 and patterned in a mask process to form a semiconductor layer 115. The semiconductor layer 115 includes an active layer 115a made of intrinsic amorphous silicon and an extrinsic amorphous silicon pattern 115b.

Figure 8C:
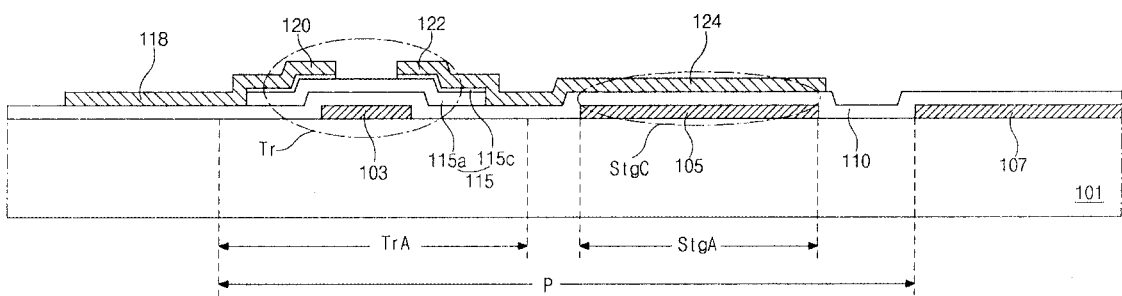

Referring to FIG. 8C, a second metal layer is formed on the substrate 101 having the semiconductor layer 115 and patterned in a mask process to form a data line 118, and source and drain electrodes 120 and 122 spaced apart from each other. The second metal layer may be made of one of molybdenum (Mo), copper (Cu), titanium alloy and aluminum alloy (e.g. AlNd). Alternatively, the second metal layer may have a multiple layered structure using the materials. For example, a titanium alloy/molybdenum structure may be used as a double-layered structure, and a molybdenum/aluminum alloy/molybdenum structure may be used as a triple-layered structure. The data line 118 crosses the gate line 107 to define a pixel region P. The portion of the drain electrode 122 overlapping the first storage electrode 105 is referred to as a second storage electrode 124. The second storage electrode 124 and the first storage electrode 105 together with the gate insulating layer 110 therebetween form a storage capacitor StgC in the storage region StgA.

The extrinsic amorphous silicon pattern (115b of FIG. 8B) is patterned in a dry-etching process using the source and drain electrodes 120 and 122 as an etching mask. Through the dry-etching process, a portion of the extrinsic amorphous silicon pattern between the source and drain electrodes 120 and 122 is removed to form an ohmic contact layer 115c below each of the source and drain electrodes 120 and 122. A portion of the active layer 115a between the source and drain electrodes 120 and 122 is exposed.

The gate electrode 103, the semiconductor layer 115 and the source and drain electrodes 120 and 122 form a thin film transistor Tr in the switching region TrA.

Figure 8D:
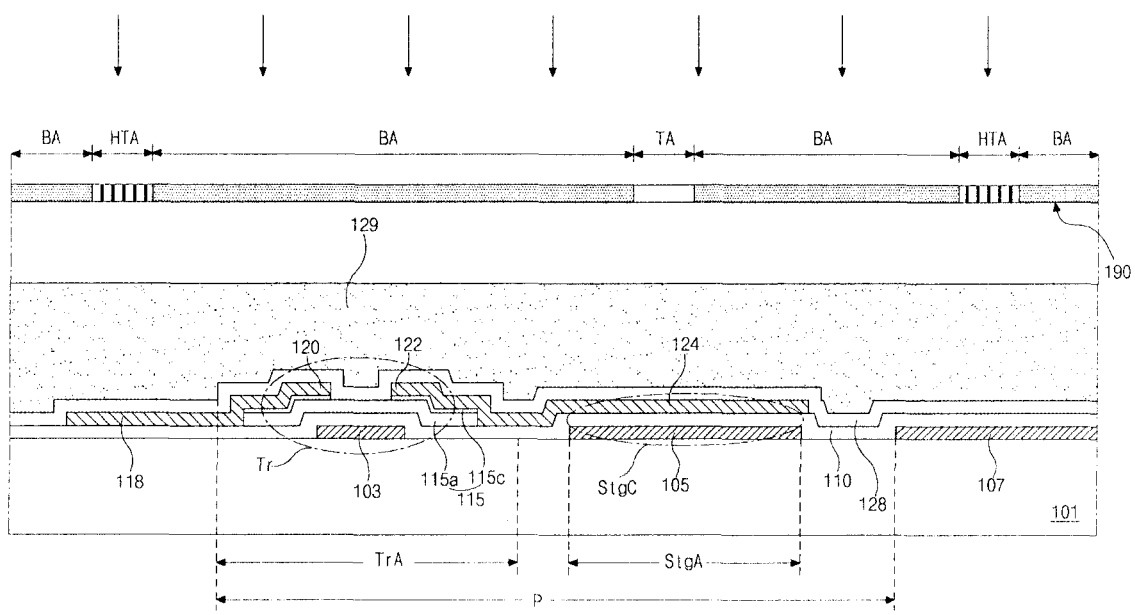

Referring to FIG. 8D, a first passivation layer 128 is formed on the substrate 101 having the source and drain electrodes 120 and 122. The first passivation layer 128 may be made of an inorganic insulating material, such as silicon oxide ($SiO_2$) or silicon nitride (SiNx). The first passivation layer 128 may not cover the gate line 107.

Then, an organic insulating layer 129 is formed on the first passivation layer 128. The organic insulating layer 129 may be made of photo acrylic or benzocyclobutene (BCB). The organic insulating layer 129 may be coated with a thickness of about 3 micrometers (μm) to 5 micrometers (μm).

When the organic insulating layer 129 has a photosensitivity, an extra photoresist layer may not be formed on the organic insulating layer (the second passivation layer) 129. Assuming that the organic insulating layer 129 is made of a positive type photosensitive material, a mask 190 is over the organic insulating layer 129. A halftone mask or diffraction mask may be used as the mask 190. The mask 190 may include a transmissive portion TA, a semi-transmissive portion HTA, and a blocking portion BA. A transmissivity of the semi-transmissive portion HTA is between a transmissivity of the transmissive portion TA and a transmissivity of the blocking portion BA. To do this, the semi-transmissive portion HTA may be configured to include a plurality of slits or a halftone film.

The transmissive portion TA corresponds to at least a portion of the drain electrode 122. The semi-transmissive portions HTA each correspond to at least a portion of the gate line 107 and at least a portion of the data line 118, respectively. A light exposure is performed through the mask 190, and then a developing process is performed.

Figure 8E:
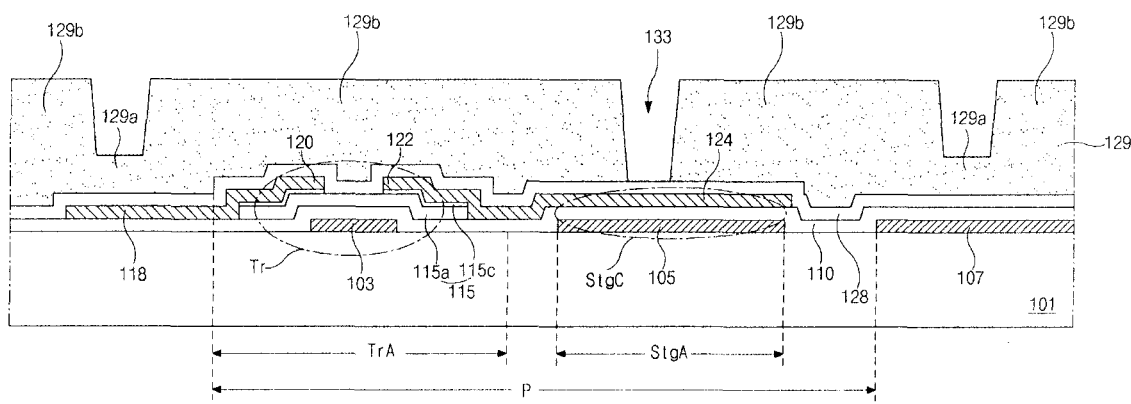

Referring to FIG. 8E, through the light exposure and developing process, the organic insulating layer 129 includes first and second portions 129a and 129b, and a drain contact hole 133. A portion of the organic insulating layer 129 corresponding to the transmissive portion (TA of FIG. 8D) is removed by the developing process so that the drain contact hole 133 is formed. A portion of the organic insulating layer 129 corresponding to the semi-transmissive portion (HTA of FIG. 8D) is partially removed by the developing process so that the first portion 129a is formed. A portion of the organic insulating layer 129 corresponding to the blocking portion (BA of FIG. 8D) is not removed by the developing process so that the second portion 129b is formed. Accordingly, the second portion 129b has a thickness more than the thickness of the first portion 129a.

Figure 8F:
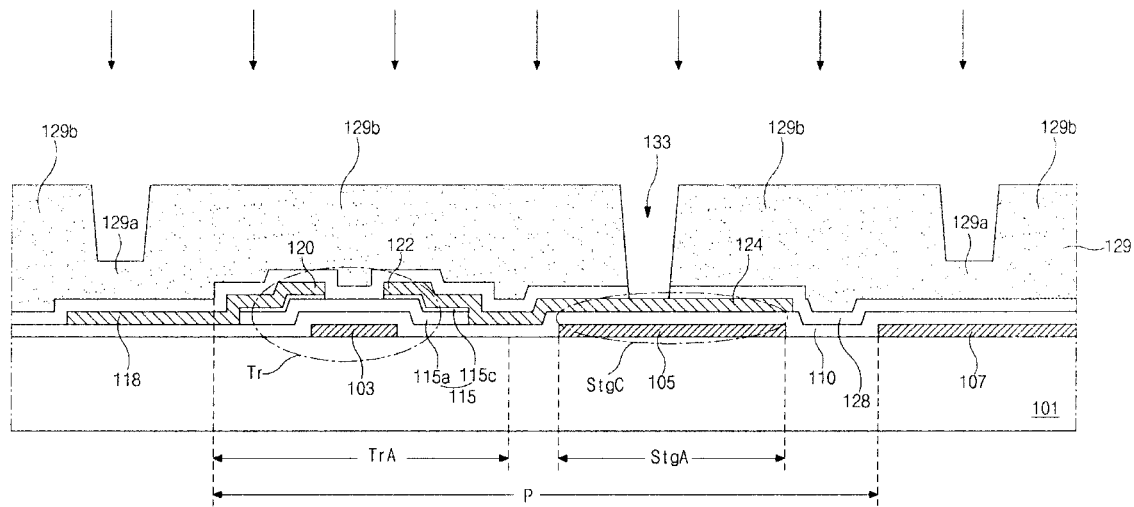

Referring to FIG. 8F, a first etching process, for example, a first dry-etching process is performed for the first passivation layer 128 using the organic insulating layer 129 as an etching mask. Accordingly, a portion of the first passivation layer 128 below the drain contact hole 133 is removed so that a portion of the drain electrode 122 below the drain contact hole 133 is exposed. The first dry-etching process may be performed with a first dry-etching gas, such as a conventional dry-etching gas.

Figure 8G:
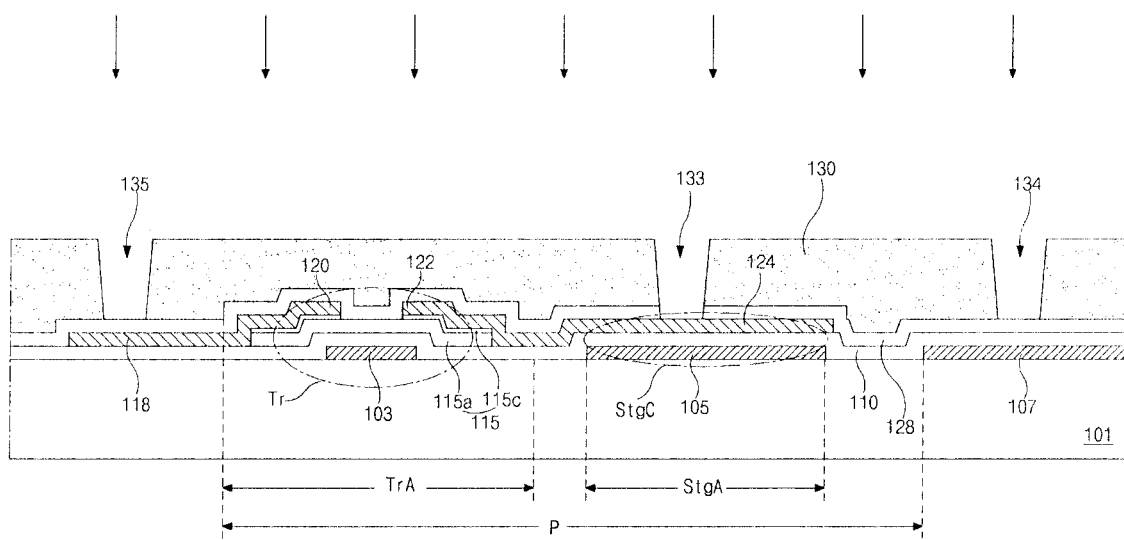

Referring to FIG. 8G, a second etching process, for example, a second dry-etching process is performed for the organic insulating layer (129 of FIG. 8F). The second dry-etching is performed until the first portion (129a of FIG. 8F) is removed. Accordingly, through the second dry-etching, first and second holes 134 and 135 are formed at positions corresponding to the first portions, and the second portion (129b of FIG. 8F) is partially removed as well. Accordingly, the thickness of the second portion is reduced as compared with the thickness of the first portion and may thus be about 2 micrometers (μm) to 4 micrometers (μm). The etched organic insulating layer by the second dry-etching is referred to as a second passivation layer 130.

Figure 8H:
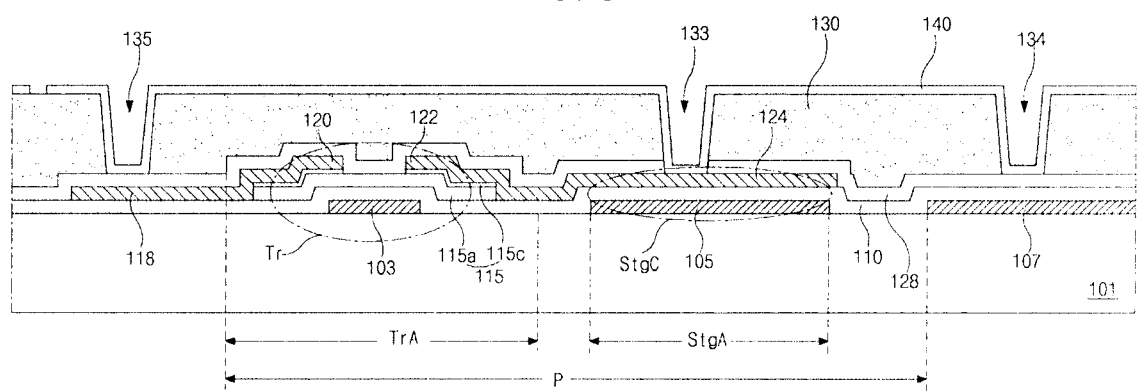

Referring to FIG. 8H, a transparent conductive material is deposited on the second passivation layer 130 and patterned in a mask process to form a pixel electrode 140. The pixel electrode 140 contacts the drain electrode 122 through the drain contact hole 133. Further, the pixel electrode 140 contacts the first passivation layer 128 through the first and second holes 134 and 135. Further, the pixel electrode 140 overlaps the gate line 107 and the data line 118.

Through the above-described processes, the array substrate for the electrophoresis type display device can be fabricated.

The above-described processes may be modified in various manners. For example, the second passivation layer 130 may be formed corresponding to only the thin film transistor Tr, the gate line 107 and the data line 118. To do this, for example, portions of the organic insulating layer 129, except for the portions of the organic insulating layer 129 corresponding to the gate line 107, the data line 118, the thin film transistor Tr, the drain contact hole 133 and the first and second holes 134 and 135, may be made as the first portions 129*a* and be removed by the second dry-etching.

Alternatively, before the organic insulating layer 129 is coated on the first passivation layer 128, the first passivation layer 128 may be patterned in a mask process to form the drain contact hole 133 therein. In this case, the mask 190 may not have the semi-transmissive portion HTA, and the transmissive portions TA may correspond to positions where the drain contact hole 133 and the first and second holes 134 and 135 are formed. Accordingly, there may be no need for the first and second dry-etching processes, and the drain contact hole 133, as well as the first and second holes 134 and 135 of the second passivation layer 130 may be formed through a developing process of the light-exposed organic insulating layer 129.

Alternatively, a third passivation layer may be formed on the second passivation layer 130. The third passivation layer may be made of an inorganic insulating material. The third passivation layer may be patterned in a mask process to form the drain contact hole 133 therein. Further, in the mask process, the third passivation layer may be patterned to form the first and second holes 134 and 135 therein.

Alternatively, after the organic insulating layer 129 is coated, the third passivation layer made of an inorganic insulating material may be deposited and then a photoresist layer is formed on the third passivation layer. Then, a light exposure is performed using a mask similar to the mask 190 of FIG. 8D, and then a developing process is performed to form a photoresist pattern. This photoresist pattern is similar to the organic insulating layer 129 of FIG. 8E. For example, the photoresist pattern includes first and second pattern portions, and the second pattern portion has a thickness more than that of the first pattern portion. Then, the third passivation layer, the organic insulating layer 129 and the first passivation layer 128 are etched using the photoresist pattern using an etching mask to form the drain contact hole 133 exposing the drain electrode 122. Then, the first pattern portion is removed by an ashing process. Then, portions of the third passivation layer and the organic insulating layer 129 corresponding to the first pattern portion are removed to form the first and second holes 134 and 135. Then, the ashed photoresist pattern is removed by a stripping process. Accordingly, the third passivation layer is formed on the second passivation layer 130 made of an organic insulating material. Then, the pixel electrode 140 is formed on the third passivation layer. Since the third passivation layer is made of an inorganic insulating material, adhesion of the pixel electrode 140 to the third passivation layer can be improved.

The array substrate manufactured as above is coupled with, for example, an electrophoresis film. The electrophoresis film may include a base film, a common electrode on the base film, an ink layer on the common electrode, and an adhesive layer on the ink layer. The array substrate is coupled with the electrophoresis film through the adhesive layer. The base film may be made of polyethylen terephthalate (PET). The ink layer may include a plurality of capsules, and the capsule includes a plurality of white pigments and a plurality of black pigments. One of the white and black pigments is charged with positive polarity while the other of the white and black pigments is charged with negative polarity. This electrophoresis type display device may be referred to as a mono electrophoresis type display device.

Alternatively, a color filter layer may be formed in the electrophoresis film. For example, red, green and blue color filter patterns are formed on an outer surface of the base film. The common electrode, the ink layer and the adhesive layer may be sequentially formed on an inner surface of the base film. The red, green and blue color filter patterns may be formed in respective pixel regions P. For example, a red resin is coated on the outer surface of the base film and patterned using a mask process to form the red color filter pattern in a red pixel region. In similar manner, the green and blue color filter patterns are formed in green and blue pixel regions, respectively. Such process of forming the color filter layer may be performed after attaching the electrophoresis film to the array substrate. Then, a transparent opposing substrate may be on the color filter layer and coupled with the array substrate using a seal pattern. The seal pattern may be formed along a non-display region outside a display region. Accordingly, the array substrate is coupled with the opposing substrate using the seal pattern therebetween. Alternatively, the opposing substrate may be a film type substrate and attached with the color filter layer using an adhesive layer, and this adhesive layer may be formed on an inner surface of the opposing substrate.

Alternatively, the color filter layer may be formed on the inner surface of the opposing substrate instead of the electrophoresis film, then the color filter layer may be coupled with the array substrate which is attached with the electrophoresis film.

Figure 9:
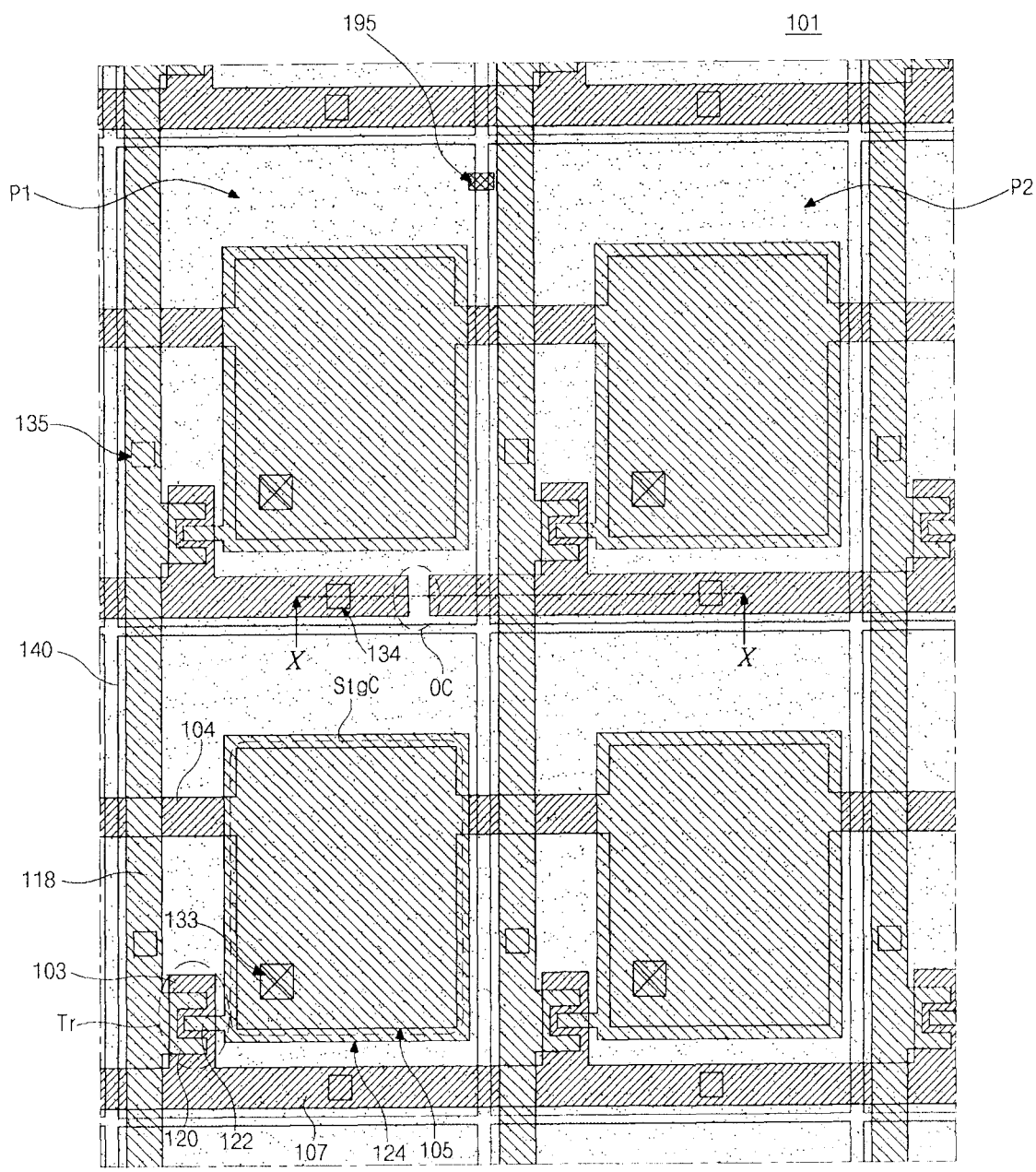
FIG. 9 is a plan view illustrating the electrophoresis type display device after performing repairing an open-circuited gate line according to the embodiment of the present invention.
Figure 10A:
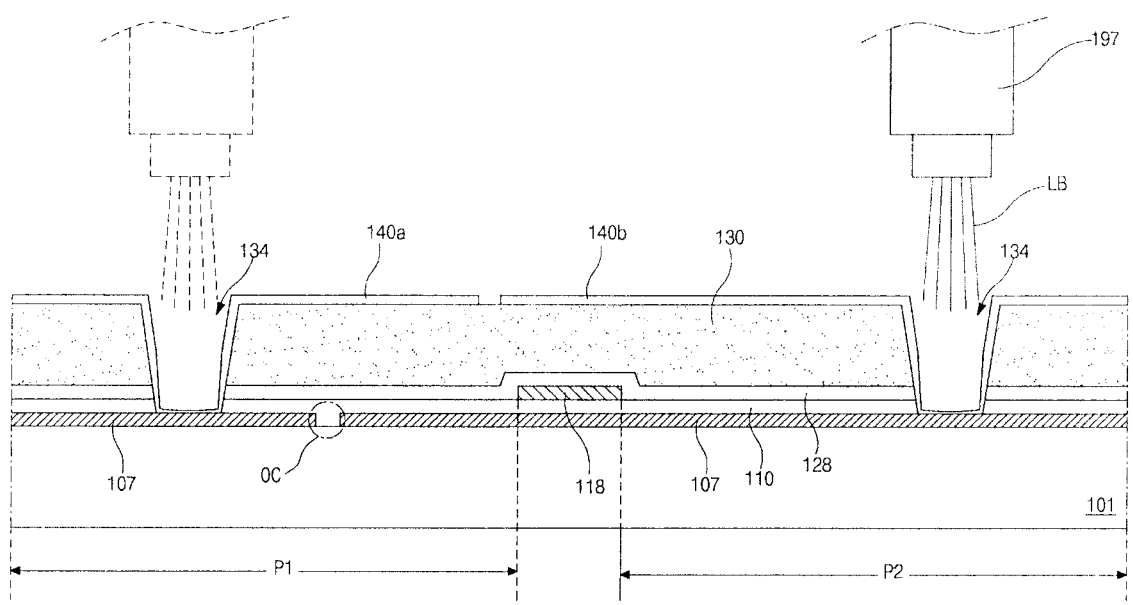
FIGS. 10A and 10B are cross-sectional views, taken along a line X-X of FIG. 9, illustrating processes of repairing the open-circuited gate line according to the embodiment of the present invention.
Figure 10B:
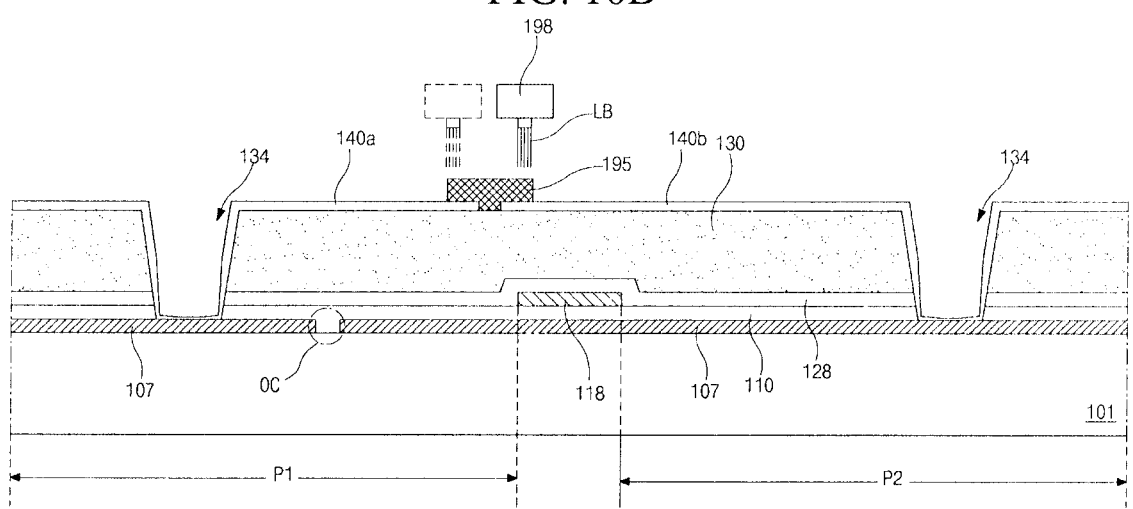

A method of repairing, for example, an open-circuited gate line in the electrophoresis type display device is explained with respect to FIGS. 9, 10A and 10B. A similar method may be applied to repairing an open-circuited data line.

FIG. 9 is a plan view illustrating the electrophoresis type display device after performing repairing an open-circuited gate line according to the embodiment of the present invention, and FIGS. 10A and 10B are cross-sectional views, taken along a line X-X of FIG. 9, illustrating processes of repairing the open-circuited gate line according to the embodiment of the present invention.

For explanation of the repairing processes, it is assumed that an open-circuited portion OC of a gate line 107 occurs below a pixel electrode 140*a* of a first pixel region P1, the pixel electrode of the first pixel region P1 is referred to as a first pixel electrode 140*a*, a pixel electrode at a second pixel region P2 neighboring to the first pixel region P1 is referred to as a second pixel electrode 140*b*.

Referring to FIGS. 9 and 10A, the open-circuited portion OC is located between a first hole 134 corresponding to the first pixel electrode 140*a* and a first hole 134 corresponding to the second pixel electrode 140*b*. A laser beam LB having a predetermined energy density is irradiated on both first holes 134 by a laser beam irradiation apparatus 197. Accordingly, each of the first and second pixel electrodes 140*a* and 140*b* corresponding to the first holes 134 is melted, and portions of the first passivation layer 128 and the gate insulating layer 110 below the first hole 134 are burned away. By removing the portions of the first passivation layer 128 and the gate insulating layer 110, a contact hole exposing the gate line 107 is formed below each first hole 134. Each of the melted first and second pixel electrodes 140*a* and 140*b* streams down the inner walls of the contact hole and contacts the exposed gate line 107. Since the first passivation layer 128 and the gate insulating layer 110 are both made of inorganic insulating material, the inner wall surfaces of the contact hole are smooth so that the melted pixel electrodes 140*a* and 140*b* can flow down the inner walls well substantially without hindrance. Further, the height of the contact hole, i.e., a total thickness of the gate insulating layer 110 and the first passivation layer 128 is about equal to or less than 0.5 micrometers (μm). Accordingly, the melted amount of each of the first and second pixel electrodes 140*a* and 140*b* is enough to cover the inner wall surfaces of the contact hole. As such, since the first passivation layer 128 and the gate insulating layer 110 are made of inorganic insulating material, and the first holes 134 are already formed, the contact defect between the pixel electrodes 140*a* and 140*b* and the gate line 107 can be prevented when the welding process using the laser beam LB is performed.

Referring to FIGS. 9 and 10B, after the welding process is performed at the first holes 134 at both sides of the open-circuited portion OC of the gate line 107, the first and second pixel electrodes 140*a* and 140*b* are electrically connected, for example, through a connection pattern 195. The connection pattern 195 contacts both of a side portion of the first pixel electrode 140*a* and a side portion of the second pixel electrode 140*b* which is opposite to the side portion of the first pixel electrode 140*b*, and crosses the gap between the first and second pixel electrodes 140*a* and 140*b*. This connecting process may be performed using a laser CVD repair apparatus 198. For example, a repair gas having predetermined ingredients for forming the connection pattern 195 is supplied between the laser CVD repair apparatus 198 and the substrate 101, and the laser CVD repair apparatus 198, for example, a laser beam LB is irradiated along between the side portion of the first pixel electrode 140*a* and the side portion of the second pixel electrode 140*b* by a laser beam irradiation device of the laser CVD repair apparatus 198. Accordingly, the repair gas is reacted with the laser beam LB, and the repair gas is photodecomposed. Particles of the photodecomposed repair gas are deposited along a traveling path of the laser beam LB so that the connection pattern 195 is formed. The repair gas may include tungsten hexacarbonyl (W(CO)$_6$), and the connection pattern 195 may made of a material including at least tungsten (W). The connection pattern 195 may have a bar shape.

As explained above, by connecting the first and second pixel electrodes 140*a* and 140*b* to the gate line 107 and connecting the first pixel electrode 140*a* to the second pixel electrode 140*b* through the connection pattern 195, the repair process is completed. Accordingly, the gate signal applied to the open-circuited gate line 107 bypasses the open-circuited portion OC of the gate line 107 and flows through the first and second pixel electrodes 140*a* and 140*b*. The first and second pixel regions P1 and P2 used for the repair process are not normally operated but become defective pixel regions, for example, bright or dark points. However, other pixel regions along the open-circuited gate line 107 can be normally operated, and the electrophoresis type display device is no need to fall into disuse. Accordingly, production efficiency and cost can be remarkably improved.

The repair process as described above can be applied to a repair process for the data line 118. For example, when the data line 118 has an open-circuited portion, the welding process is performed at the second holes 135 located at both sides of the open-circuited portion of the data line 118, and both pixel electrodes corresponding to the second holes 135, respectively, are connected through a connection pattern. Accordingly, a bypass for the open-circuited data line is completed, and a data signal applied to the open-circuited data line can thus flow through both pixel regions corresponding to the both pixel electrodes. In the repair process for the data line 118, the first passivation layer 128 is removed for the welding process.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for an electrophoresis type display device, comprising:
   a plurality of gate lines on a substrate;
   a gate insulating layer on the plurality of gate lines;
   a plurality of data lines on the gate insulating layer and crossing the plurality of gate lines to define a plurality of pixel regions;
   a thin film transistor corresponding to each pixel region, the thin film transistor including a gate electrode, a semiconductor layer, and source and drain electrodes;
   a first passivation layer on the plurality of data lines;
   a second passivation layer on the first passivation layer, the second passivation layer including a first hole over the data line, and a second hole over the gate line;
   a pixel electrode on the second passivation layer and connected to the drain electrode; and
   an electrophoresis ink layer over the pixel electrode,
   wherein a portion of the pixel electrode covers the first hole, and another portion of the pixel electrode covers the second hole,
   wherein the second passivation layer entirely covers the pixel region, and
   wherein the pixel electrode is disposed continuously over the first and second holes and the drain electrode.

2. The array substrate according to claim 1, further comprising a third passivation layer comprising an inorganic insulating material and disposed between the pixel electrode and the second passivation layer.

3. The array substrate according to claim 1, wherein:
   each of the gate insulating layer and the first passivation layer comprises an inorganic insulating material; and
   the second passivation layer comprises an organic insulating material.

4. The array substrate according to claim 3, wherein a thickness of the second passivation layer is about 2 micrometers to about 4 micrometers.

5. An array substrate for an electrophoresis type display device, comprising:
   a plurality of gate lines on a substrate;
   a gate insulating layer on the plurality of gate lines;
   a plurality of data lines on the gate insulating layer and crossing the plurality of gate lines to define a plurality of pixel regions;
   a thin film transistor corresponding to each pixel region, the thin film transistor including a gate electrode, a semiconductor layer, and source and drain electrodes;
   a first passivation layer on the plurality of data lines;
   a second passivation layer on the first passivation layer, the second passivation layer including a first hole over the data line and a second hole over the gate line;
   a pixel electrode on the second passivation layer and connected to the drain electrode; and an electrophoresis ink layer over the pixel electrode,
wherein the pixel electrode covers the first hole or the second hole,
wherein the second passivation layer entirely covers the pixel region, and
wherein the pixel electrode is disposed continuously over the first and second holes and the drain electrode.

6. The array substrate according to claim 5, further comprising a third passivation layer comprising an inorganic insulating material and disposed between the pixel electrode and the second passivation layer.

7. The array substrate according to claim 5, wherein:
each of the gate insulating layer and the first passivation layer comprises an inorganic insulating material; and
the second passivation layer comprises an organic insulating material.

8. The array substrate according to claim 7, wherein a thickness of the second passivation layer is about 2 micrometers to about 4 micrometers.

\* \* \* \* \*